(12) United States Patent
Shiga

(10) Patent No.: US 7,313,031 B2
(45) Date of Patent: Dec. 25, 2007

(54) INFORMATION PROCESSING APPARATUS AND METHOD, MEMORY CONTROL DEVICE AND METHOD, RECORDING MEDIUM, AND PROGRAM

(75) Inventor: Tomohisa Shiga, Kanagawa (JP)

(73) Assignee: Sony Corporation, Tokyo (JP)

( * ) Notice: Subject to any disclaimer, the term of this patent is extended or adjusted under 35 U.S.C. 154(b) by 112 days.

(21) Appl. No.: 11/360,301

(22) Filed: Feb. 23, 2006

(65) Prior Publication Data

US 2006/0193182 A1 Aug. 31, 2006

(30) Foreign Application Priority Data

Feb. 25, 2005 (JP) ............................ P2005-050657

(51) Int. Cl.
*G11C 7/10* (2006.01)
(52) U.S. Cl. ........................... 365/189.04; 365/230.05; 365/205
(58) Field of Classification Search ........... 365/189.04, 365/154, 230.05, 205, 156
See application file for complete search history.

(56) References Cited

U.S. PATENT DOCUMENTS 5,847,990 A * 12/1998 Irrinki et al. ............... 365/154

2004/0075858 A1 * 4/2004 Namizuka .................. 358/1.13

FOREIGN PATENT DOCUMENTS

| JP | 2000 244518 | 9/2000 |
| JP | 2002 132707 | 5/2002 |
| JP | 2003 16024 | 1/2003 |
| JP | 2004 62900 | 2/2004 |

* cited by examiner

*Primary Examiner*—Anh Phung
*Assistant Examiner*—Dang Nguyen
(74) *Attorney, Agent, or Firm*—Frommer Lawrence & Haug LLP; William S. Frommer, Esq.

(57) ABSTRACT

A memory control device for writing to a memory data input via a port section and for reading from the memory data output via the port section includes setting means for setting, in accordance with a transfer speed of first input data input via the port section, a write-enable time for enabling writing of the first input data for each predetermined period and for setting, in accordance with a transfer speed of first output data output via the port section, a read-enable time for enabling reading of the first output data for the predetermined period; and write/read control means for controlling data writing/reading to/from the memory such that second input data input via the port section is written or second output data output via the port section is read within a time other than the write-enable and read-enable times within the predetermined period.

16 Claims, 8 Drawing Sheets

221-1  221-2  221-3  221-4

222-1  222-2  222-3  222-4

INFORMATION PROCESSING APPARATUS AND METHOD, MEMORY CONTROL DEVICE AND METHOD, RECORDING MEDIUM, AND PROGRAM

CROSS REFERENCES TO RELATED APPLICATIONS

The present invention contains subject matter related to Japanese Patent Application JP 2005-050657 filed in the Japanese Patent Office on Feb. 25, 2005, the entire contents of which are incorporated herein by reference.

BACKGROUND OF THE INVENTION

1. Field of the Invention

The present invention relates to information processing apparatuses and methods, memory control devices and methods, recording media, and programs, and more particularly, to an information processing apparatus and method, a memory control device and method, a recording medium, and a program that are capable of writing/reading data to/from a memory efficiently and reliably.

2. Description of the Related Art

Technologies for writing/reading to/from a memory data input/output via a plurality of ports of a computer or a recorder have been discussed.

For example, a data recording/reproducing apparatus in which, from among time slots acquired by splitting a usage time of an input/output bus for a memory into a predetermined number of separated times, time slots are regularly allocated only to an input/output port for AV data that needs to be processed in real time and time slots that are not used for the input/output port for the AV data are allocated, when necessary, to an input/output port for asynchronous data that does not need to be processed in real time is proposed, for example, in Japanese Unexamined Patent Application Publication No. 2000-299835.

SUMMARY OF THE INVENTION

In recent years, apparatuses connected to computers or recorders are diversified into various types, and the transfer speed of data input/output to/from such apparatuses varies in a wide range. Thus, efficiently and reliably writing/reading data to/from a memory by flexibly changing, in accordance with a data transfer speed, access times for the memory allocated to respective ports is required.

However, known computers and recorders do not have mechanisms for writing/reading to/from a memory externally input/output data while access times for the memory allocated to respective ports are flexibly changed.

For example, in the peripheral component interconnect (PCI) bus specification, which is the specification of a bus inside a currently standard computer, for a case where data is externally input to the computer, a signal requiring data input is asserted from an external apparatus to the computer. In response to this, after the computer asserts to the external apparatus an enabling signal for enabling data input, external data input starts, and the data is written into a memory inside the computer. However, for example, if a central processing unit (CPU) inside the computer uses all the time slots for a memory input/output bus, an enabling signal cannot be asserted with respect to a request for data input from the outside. Thus, writing of data from the outside may be delayed or data missing may occur since a buffer for temporarily storing input data overflows.

In addition, similarly, for a case where data is output to an external apparatus, for example, if the CPU inside the computer uses all the time slots for the memory input/output bus, reading of data from the memory in response to a request for data output from the outside may be delayed.

For example, when an external apparatus processes real-time processing data, such as moving image data or audio data, which needs to be processed in real time, delay in writing/reading data to/from a memory causes an error, such as data missing or time out.

It is desirable to efficiently and reliably write/read data to/from a memory.

A memory control device according to an embodiment of the present invention for writing to a memory data input via a port section and for reading from the memory data output via the port section includes setting means for setting, in accordance with a transfer speed of first input data input via the port section, a write-enable time for enabling writing of the first input data to the memory for each predetermined period and for setting, in accordance with a transfer speed of first output data output via the port section, a read-enable time for enabling reading of the first output data from the memory for the predetermined period; and write/read control means for controlling data writing/reading to/from the memory such that second input data input via the port section is written to the memory or second output data output via the port section is read from the memory within a time other than the write-enable time and the read-enable time within the predetermined period.

The port section may include a plurality of ports. The first input data may be input via a first port. The first output data may be output via the first port. The second input data may be input via a second port. The second output data may be output via the second port.

The first input data and the first output data may be real-time processing data to be processed in roughly real time.

The second input data and the second output data may be data to be processed by a processor of an apparatus provided with the memory.

The write/read control means may allocate the write-enable time and the read-enable time for the predetermined period, and may control data writing/reading to/from the memory such that the first input data is written to the memory within the write-enable time and that the first output data is read from the memory within the read-enable time.

The write/read control means may control data writing/reading to/from the memory such that, when writing of the first input data is not required, the second input data is written to the memory or the second output data is read from the memory within the write-enable time.

The write/read control means may control data writing/reading to/from the memory such that, when reading of the first output data is not required, the second input data is written to the memory or the second output data is read from the memory within the read-enable time.

The write/read control means may allocate the time other than the write-enable time and the read-enable time within the predetermined period to an initial portion of the predetermined period.

The setting means may set the write-enable time and the read-enable time in accordance with the number of time slots acquired by splitting the predetermined period into a predetermined number of equally separated times.

A memory control method and a first program recorded on a recording medium according to an embodiment of the present invention for writing to a memory data input via a port section and for reading from the memory data output via the port section include the steps of setting a write-enable time for enabling writing of first input data to the memory for each predetermined period in accordance with a transfer speed of the first input data input via the port section and a read-enable time for enabling reading of first output data from the memory for the predetermined period in accordance with a transfer speed of the first output data output via the port section; and controlling data writing/reading to/from the memory such that second input data input via the port section is written to the memory or second output data output via the port section is read from the memory within a time other than the write-enable time and the read-enable time within the predetermined period.

An information processing apparatus according to an embodiment of the present invention includes a memory for storing data; setting means for setting, in accordance with a transfer speed of first input data input via a port section, a write-enable time for enabling writing of the first input data to the memory for each predetermined period and for setting, in accordance with a transfer speed of first output data output via the port section, a read-enable time for enabling reading of the first output data from the memory for the predetermined period; and write/read control means for controlling data writing/reading to/from the memory such that second input data input via the port section is written to the memory or second output data output via the port section is read from the memory within a time other than the write-enable time and the read-enable time within the predetermined period.

The information processing apparatus may further include image processing means for performing image processing on data output from the port section and for inputting data subjected to the image processing to the port section.

In the memory control device, the memory control method, and the first program recorded on the recording medium, a write-enable time for enabling writing of first input data to the memory is set for each predetermined period in accordance with a transfer speed of the first input data input via the port section, and a read-enable time for enabling reading of first output data from the memory is set for the predetermined period in accordance with a transfer speed of the first output data output via the port section. Data writing/reading to/from the memory is controlled such that second input data input via the port section is written to the memory or second output data output via the port section is read from the memory within a time other than the write-enable time and the read-enable time within the predetermined period.

As described above, data can be written to and read from the memory. In addition, writing and reading of data to and from the memory can be performed efficiently and reliably.

DESCRIPTION OF THE PREFERRED EMBODIMENTS

Figure 1:
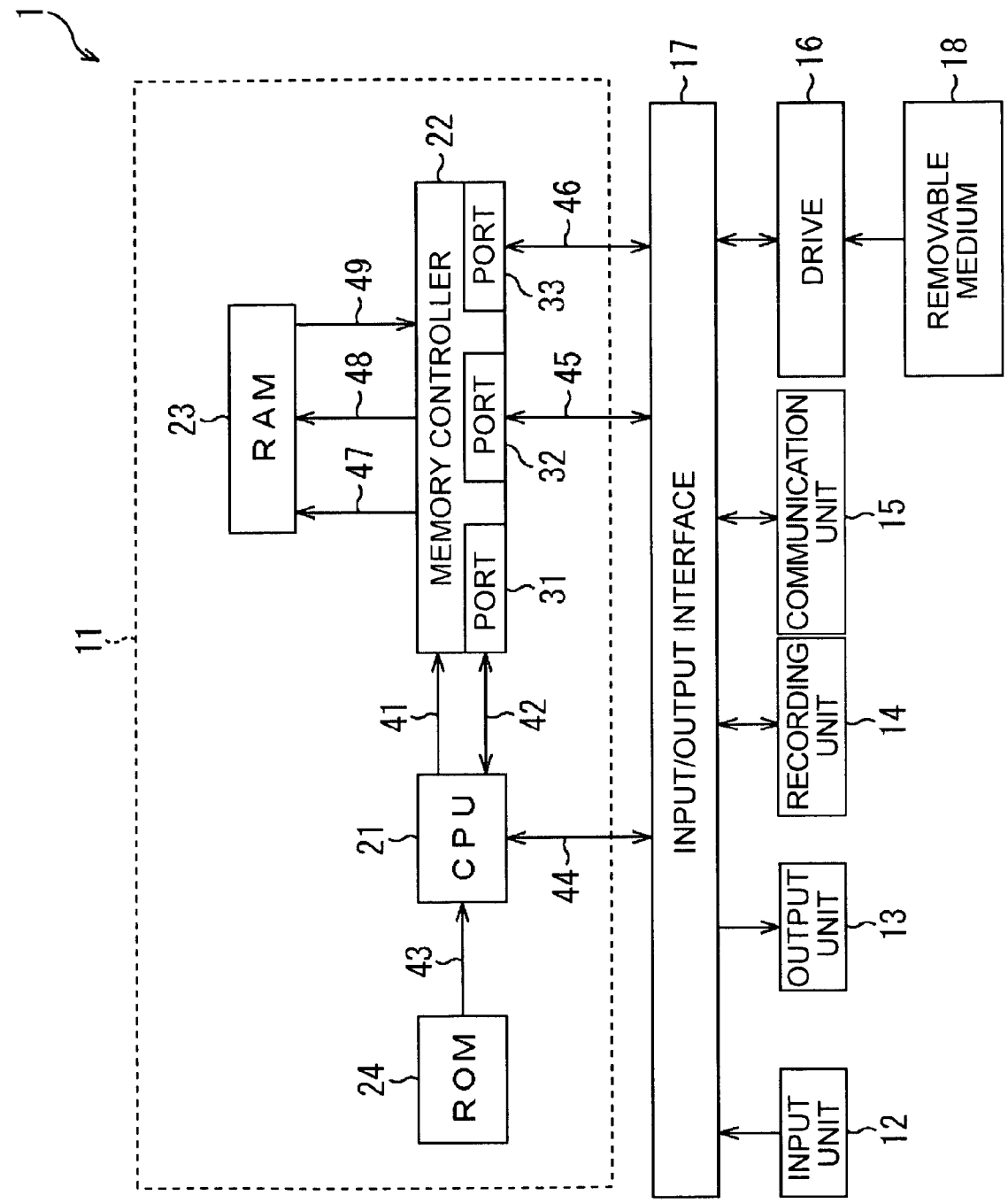
FIG. 1 is a block diagram showing a computer according to an embodiment of the present invention.

FIG. 1 shows a computer 1 according to an embodiment of the present invention. The computer 1 includes a data processing unit 11, an input unit 12, an output unit 13, a recording unit 14, a communication unit 15, and a drive 16. The data processing unit 11, which performs data processing, includes a central processing unit (CPU) 21, a memory controller 22, a random-access memory (RAM) 23, and a read-only memory (ROM) 24. The memory controller 22 also includes ports 31 to 33.

The CPU 21 and the memory controller 22 are connected to each other via buses 41 and 42. The bus 42 is connected to the port 31. The CPU 21 and the ROM 24 are connected to each other via a bus 43. The CPU 21 and an input/output interface 17 are connected to each other via a bus 44. The memory controller 22 and the input/output interface 17 are connected to each other via buses 45 and 46. The bus 45 is connected to the port 32, and the bus 46 is connected to the port 33. The memory controller 22 and the RAM 23 are connected to each other via buses 47, 48, and 49. The input unit 12, the output unit 13, the recording unit 14, the communication unit 15, and the drive 16 are connected to each other via the input/output interface 17.

The CPU 21 receives, via the input/output interface 17 and the bus 44, processing instructions and data input by a user using the input unit 12. The CPU 21 performs, in response to input processing instructions, various types of processing in accordance with a program stored in the ROM 24 or a program loaded from the recording unit 14 to the RAM 23 via the input/output interface 17, the bus 45 or 46, the memory controller 22, and the buses 47 and 48.

In addition, the CPU 21 calculates, in accordance with the transfer speed of data input/output via the ports 32 and 33, a time during which writing to the RAM 23 data input via the port 32 is permitted, a time during which reading from the RAM 23 data output via the port 32 is permitted, a time during which writing to the RAM 23 data input via the port 33 is permitted, and a time during which reading from the RAM 23 data output via the port 33 is permitted, which are set for each predetermined period. Then, the CPU 21 supplies to the memory controller 22 via the bus 41 access time setting signals for setting the calculated times for the memory controller 22.

A write packet for instructing writing of data to the RAM 23 or a read packet for instructing reading of data from the RAM 23 is input from the CPU 21 to the port 31 of the memory controller 22 via the bus 42. A write packet for instructing writing of data to the RAM 23 or a read packet for instructing reading of data from the RAM 23 is input from each unit of the computer 1 or an external apparatus (not shown) connected to the input/output interface 17 to the port 32 of the memory controller 22 via the input/output interface 17 and the bus 45. A write packet for instructing writing of data to the RAM 23 or a read packet for instructing reading of data from the RAM 23 is input from each unit of the computer 1 or an external apparatus (not shown) connected to the input/output interface 17 to the port 33 of the memory controller 22 via the input/output interface 17 and the bus 46.

Figure 6:
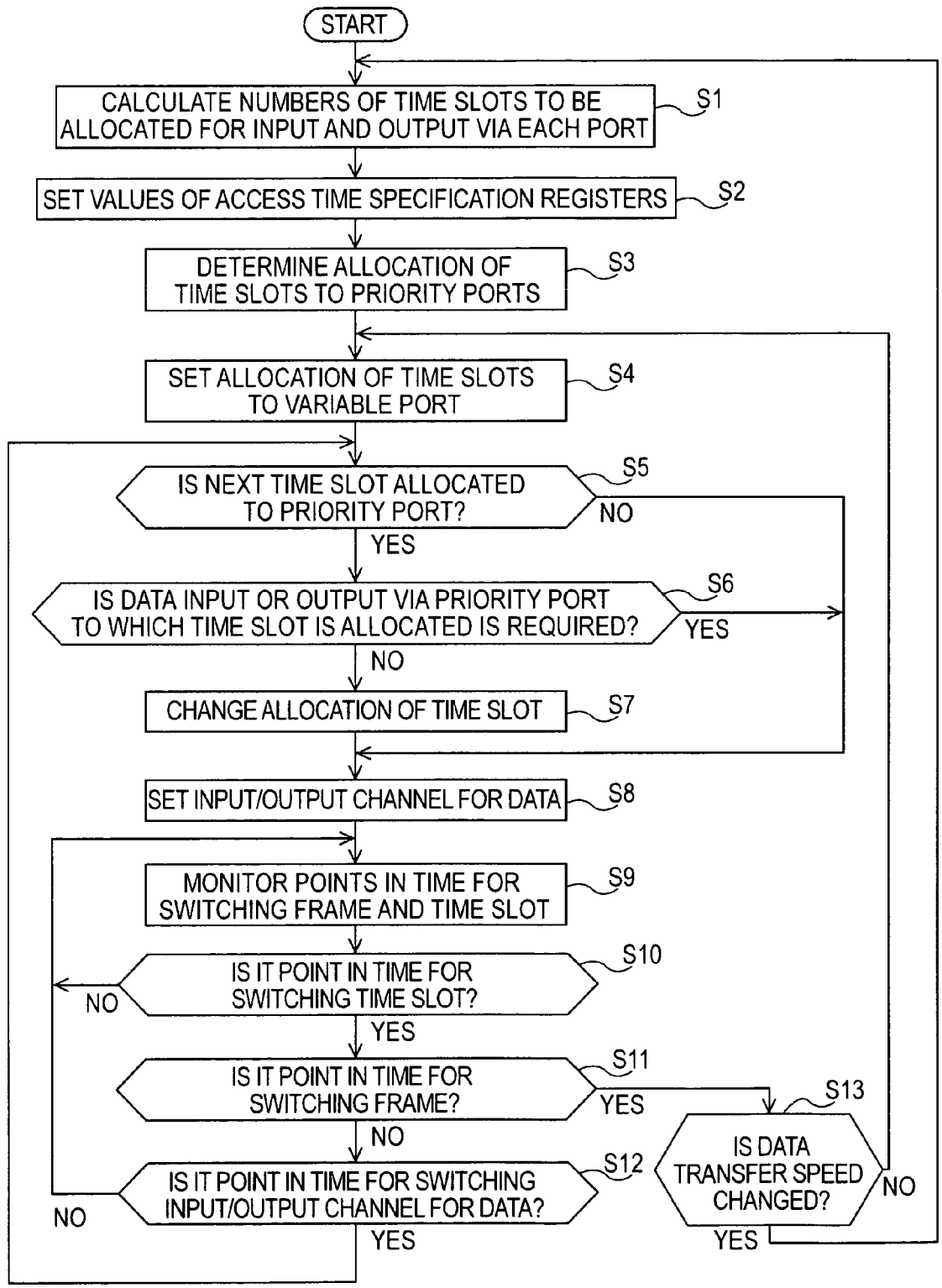
FIG. 6 is a flowchart showing a data write/read process performed by the computer shown in FIG. 1.

As described later with reference to FIG. 6, the memory controller 22 splits, in accordance with a clock signal supplied from the outside (for example, from the CPU 21), a usage time of the bus 47 for inputting data to the RAM 23 and the bus 49 for acquiring data output from the RAM 23 into a predetermined number of separated periods, which are, hereinafter, referred to as frames (for example, a frame corresponds to 1 microsecond). In addition, the memory controller 22 controls writing and reading of data to and from the RAM 23 in synchronization with a time slot acquired by splitting a frame into a predetermined number of equally separated times (for example, equally separated eighteen times) in accordance with an instruction based on a write packet or a read packet.

Hereinafter, writing of data to the RAM 23 and reading of data from the RAM 23 is also referred to as writing/reading of data to/from the RAM 23.

Figure 2:
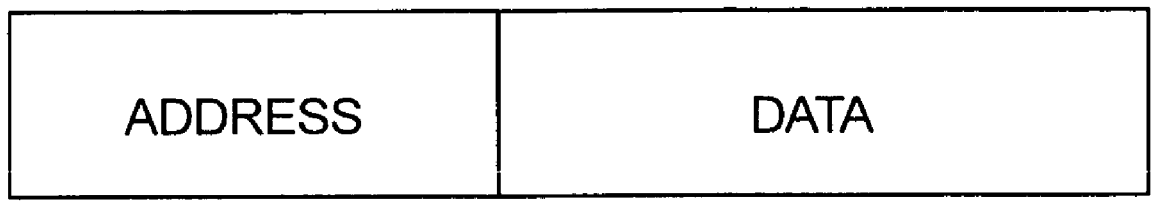
FIG. 2 shows an example of the data structure of a write packet input to a memory controller.
Figure 3:
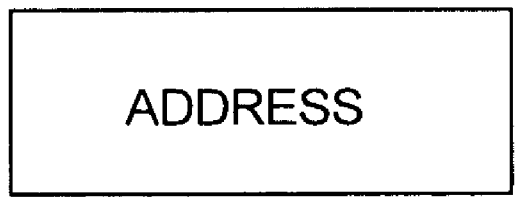
FIG. 3 shows an example of the data structure of a read packet input to the memory controller.

The data structure of a write packet and the data structure of a read packet are described next. FIG. 2 shows an example of the data structure of a write packet, and FIG. 3 shows an example of the data structure of a read packet. The write packet includes an address portion and a data portion. An address of the RAM 23 at which writing of data starts is set in the address portion, and data to be written into the RAM 23 is set in the data portion. The read packet includes an address portion. An address of the RAM 23 at which reading of data starts is set in the address portion.

The memory controller 22 separates the write packet into the address portion and the data portion. The memory controller 22 supplies the data portion to the RAM 23 via the bus 47, and supplies the address portion to the RAM 23 via the bus 48. In addition, the memory controller 22 supplies the address portion of the read packet to the RAM 23 via the bus 48. The memory controller 22 acquires, via the bus 49, the data read from the RAM 23, and outputs the read data to the outside via a port, via which the read packet for instructing reading of the data is input.

In addition, as described later with reference to FIG. 6, the memory controller 22 preferentially performs allocation of a time for writing/reading to/from the RAM 23 data input/output via the port 32 or 33, and then performs allocation of a time for writing/reading to/from the RAM 23 data input/output via the port 31. Hereinafter, the ports 32 and 33 are referred to as priority ports, and the port 31 is referred to as a variable port.

When a data portion and an address portion of a write packet are input from the memory controller 22 via the bus 47 and the bus 48, respectively, to the RAM 23, the RAM 23 starts to write data set in the data portion at the position of an address set in the address portion of the write packet. In addition, when an address portion of a read packet is input from the memory controller 22 via the bus 48 to the RAM 23, the RAM 23 reads data of a predetermined length from the position of an address set in the address portion (for example, a fixed length between tens of bytes and hundreds of bytes), and supplies the read data to the memory controller 22 via the bus 49.

The ROM 24 basically stores fixed data from among programs and parameters for computation used by the CPU 21.

The input unit 12 includes, for example, buttons, switches, a keyboard, or a mouse. The input unit 12 is operated when the user inputs various instructions to the computer 1.

The output unit 13 includes, for example, a display, such as a cathode-ray tube (CRT) or a liquid crystal display (LCD), and a speaker. The output unit 13 outputs images and sound processed by the CPU 21.

The recording unit 14 includes, for example, a hard disk. The recording unit 14 records and reproduces programs performed by the CPU 21 and information.

The communication unit 15 includes, for example, a modem and a terminal adapter. The communication unit 15 performs communication with an external information processing apparatus via a network including the Internet.

The drive 16 is connected to the input/output interface 17 according to need. A removable medium 18, such as a magnetic disk, an optical disc, a magnetic optical disc, or a semiconductor memory, is appropriately installed in the drive 16. A program read from the removable medium 18 is installed in the recording unit 14.

An external apparatus, such as a reproducing apparatus, as well as the blocks shown in FIG. 1, is connected to the input/output interface 17. Data input/output is performed between the external apparatus and the memory controller 22 via the port 32 or 33.

Figure 4:
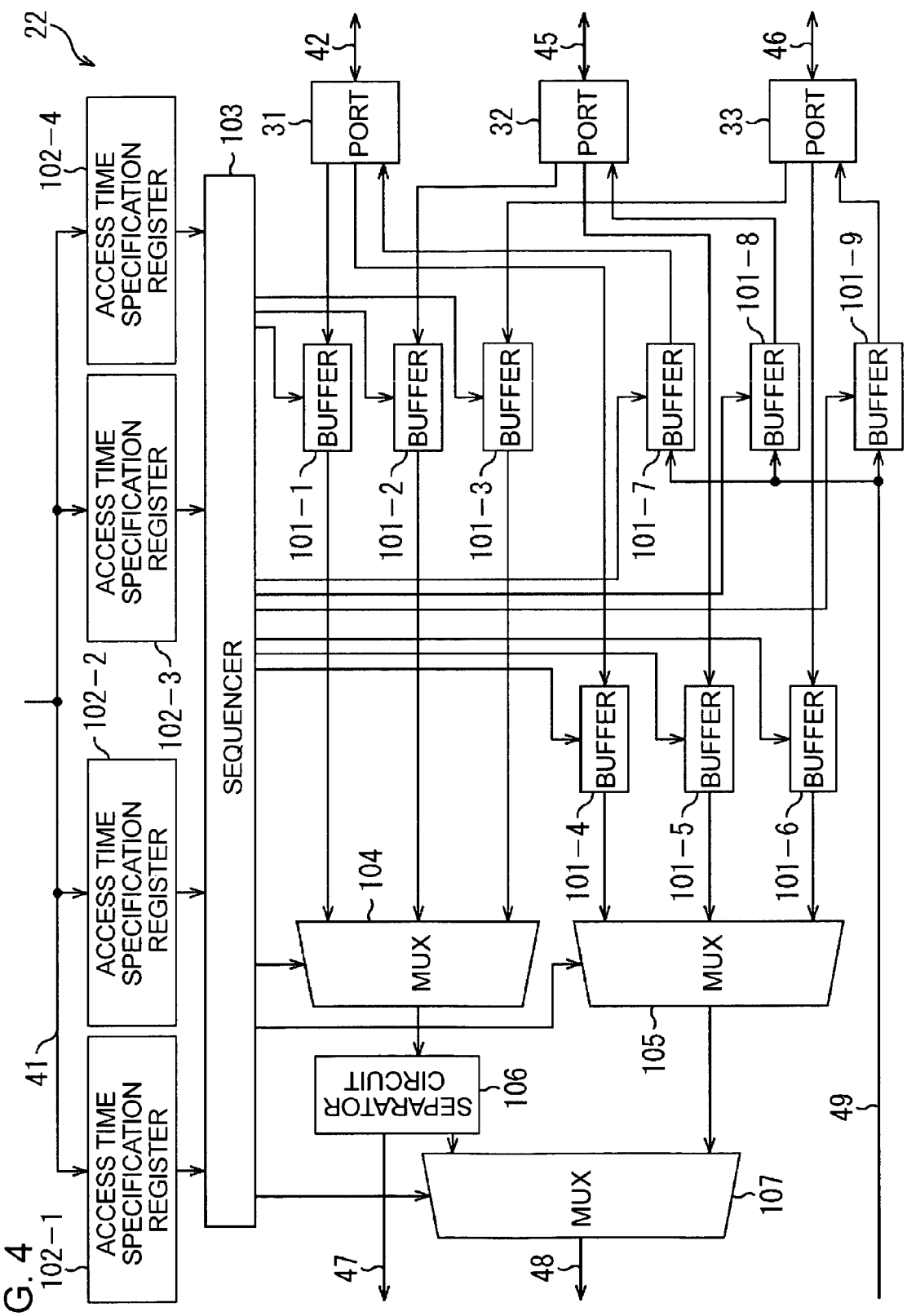
FIG. 4 is a block diagram showing an example of the functional configuration of the memory controller shown in FIG. 1.

FIG. 4 shows an example of the functional configuration of the memory controller 22. The memory controller 22 includes the ports 31 to 33, buffers 101-1 to 101-9, access time specification registers 102-1 to 102-4, a sequencer 103, multiplexers (MUXes) 104 and 105, a separator circuit 106, and a multiplexer (MUX) 107.

The port 31 supplies to the buffer 101-1 a write packet input via the bus 42 from the CPU 21, and causes the buffer 101-1 to store the input write packet. The port 31 also supplies to the buffer 101-4 a read packet input via the bus 42 from the CPU 21, and causes the buffer 101-4 to store the input read packet. In addition, the port 31 supplies to the buffer 101-7 a read instruction signal input via the bus 42 from the CPU 21, and reads data stored in the buffer 101-7. The port 31 outputs via the bus 42 to the CPU 21 the data read from the buffer 101-7.

The port 32 supplies to the buffer 101-2 a write packet input via the bus 45 from the outside, and causes the buffer 101-2 to store the input write packet. The port 32 also supplies to the buffer 101-5 a read packet input via the bus 45 from the outside, and causes the buffer 101-5 to store the input read packet. In addition, the port 32 supplies to the buffer 101-8 a read instruction signal input via the bus 45 from the outside, and reads data stored in the buffer 101-8. The port 32 outputs via the bus 45 to the outside the data read from the buffer 101-8.

The port 33 supplies to the buffer 101-3 a write packet input via the bus 46 from an external apparatus, and causes the buffer 101-3 to store the input write packet. The port 33 also supplies to the buffer 101-6 a read packet input via the bus 46 from the external apparatus, and causes the buffer 101-6 to store the input read packet. In addition, the port 33 supplies to the buffer 101-9 a read instruction signal input via the bus 46 from the outside, and reads data stored in the buffer 101-9. The port 33 outputs via the bus 46 to the outside the data read from the buffer 101-9.

The number of time slots for each frame allocated (secured) for writing/reading to/from the RAM 23 data input/ output via the port 32 or 33 is set in each of the access time specification registers 102-1 to 102-4 in accordance with an access time setting signal input via the bus 41 from the CPU 21. The number of time slots allocated for writing of data input via the port 32 is set in the access time specification register 102-1. The number of time slots allocated for writing of data input via the port 33 is set in the access time specification register 102-2. The number of time slots allocated for reading of data output via the port 32 is set in the access time specification register 102-3. The number of time slots allocated for reading of data output via the port 33 is set in the access time specification register 102-4.

Allocation of a time slot for writing to the RAM 23 data input via the port 31, 32, or 33 is also represented as allocation of a time slot for input via the port 31, 32, or 33. In addition, allocation of a time slot for reading from the RAM 23 data output via the port 31, 32, or 33 is also represented as allocation of a time slot for output via the port 31, 32, or 33. In addition, allocation of a time slot for input or output via the port 31, 32, or 33 is also represented as allocation of a time slot to the port 31, 32, or 33.

As described later with reference to FIG. 6, the sequencer 103 switches between an input channel for data to be written to the RAM 23 and an output channel for data read from the RAM 23 by supplying read instruction signals to the buffers 101-1 to 101-6, supplying write instruction signals to the buffers 101-7 to 101-9, and supplying operation control signals to the MUXes 104, 105, and 107 and the separator circuit 106 in accordance with the numbers of time slots set in the access time specification registers 102-1 to 102-4. In other words, the sequencer 103 selects a port via which data to be written to the RAM 23 is input or a port via which data read from the RAM 23 is output.

The buffers 101-1 to 101-3 supply to the MUX 104 write packets stored in the buffers 101-1 to 101-3 in accordance with read instruction signals supplied from the sequencer 103.

The buffers 101-4 to 101-6 supply to the MUX 105 read packets stored in the buffers 101-4 to 101-6 in accordance with read instruction signals supplied from the sequencer 103.

The buffers 101-7 to 101-9 store data input via the bus 49 from the RAM 23 in accordance with write instruction signals supplied from the sequencer 103. In addition, the buffers 101-7 to 101-9 supply the stored data to the ports 31 to 33 in accordance with read instruction signals supplied via the ports 31 to 33.

The MUX 104 selects one of write packets supplied from the buffers 101-1 to 101-3, that is, one of write packets input via the ports 31 to 33, in accordance with an operation control signal supplied from the sequencer 103, and supplies the selected write packet to the separator circuit 106.

The MUX 105 selects one of read packets supplied from the buffers 101-4 to 101-6, that is, one of read packets input via the ports 31 to 33, in accordance with an operation control signal supplied from the sequencer 103, and supplies the selected read packet to the MUX 107.

The separator circuit 106 separates the write packet into an address portion and a data portion in accordance with an operation control signal supplied from the sequencer 103. The separator circuit 106 supplies the data portion to the RAM 23 via the bus 47, and supplies the address portion to the MUX 107.

The MUX 107 selects one of the address portion of the read packet supplied from the MUX 105 and the address portion of the write packet supplied from the separator circuit 106 in accordance with an operation control signal supplied from the sequencer 103, and supplies the selected address portion to the RAM 23.

Figure 5:
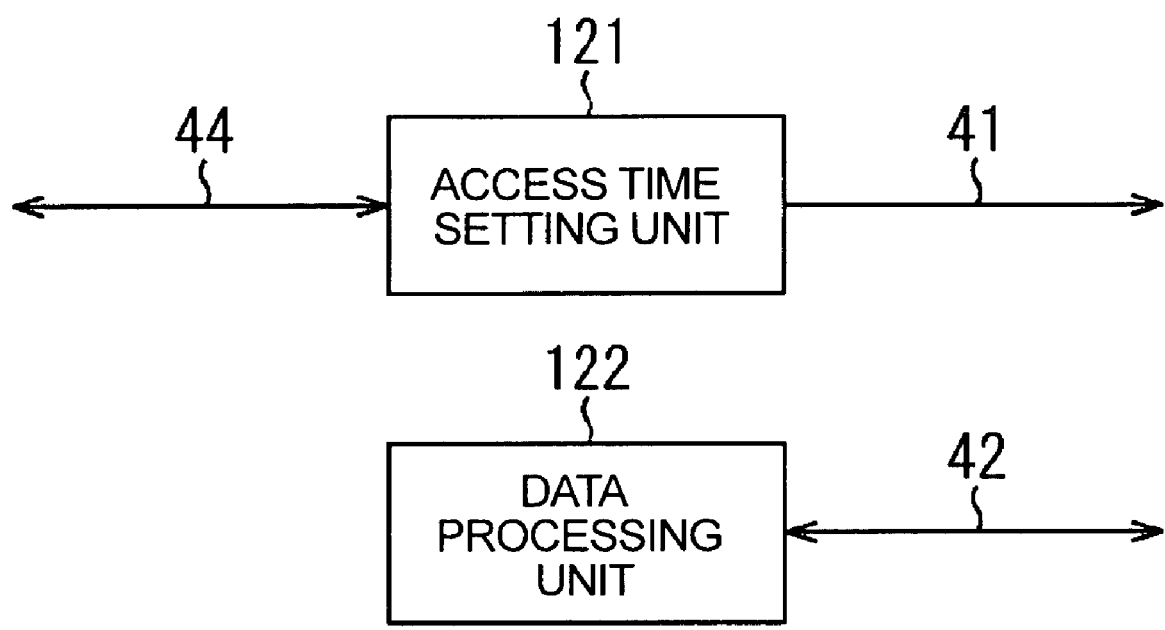
FIG. 5 is a block diagram showing an example of a part of the functional configuration implemented by a CPU shown in FIG. 1.

FIG. 5 is a block diagram showing a part of an example of the functional configuration implemented by the CPU 21 that performs a predetermined program. An access time setting unit 121 and a data processing unit 122 are implemented by the CPU 21 performing the program.

The access time setting unit 121 acquires information representing the transfer speed of data input/output via the ports 32 and 33. For example, the access time setting unit 121 acquires, via the input/output interface 17 and the bus 44, information representing a data transfer speed from an external apparatus that is connected to each unit of the computer 1 or the input/output interface 17 and that inputs/outputs data via the ports 32 and 33. The access time setting unit 121 calculates the numbers of time slots allocated for input and output via the ports 32 and 33 in accordance with the transfer speed of data input/output via the ports 32 and 33. The access time setting unit 121 generates access time setting signals representing the calculated numbers of time slots, and supplies the generated access time setting signals via the bus 41 to the access time specification registers 102-1 to 102-4.

The data processing unit 122 inputs a read packet via the bus 42 to the port 31, and instructs the memory controller 22 to read data from a specified address in the RAM 23. The data processing unit 122 inputs a read instruction signal via the bus 42 to the port 31, and causes the port 31 to output data read from the RAM 23 in accordance with the instruction based on the input read packet. The data processing unit 122 acquires the data output from the port 31 via the bus 42.

The data processing unit 122 performs various types of data processing on acquired data. For example, the data processing unit 122 combines two pieces of image data for each frame to generate a piece of image data. In addition, for example, the data processing unit 122 performs various types of image processing, editing processing, and encoding processing, such as splicing processing for splicing pieces of image data in a predetermined editing point. In addition, for example, the data processing unit 122 performs various types of data processing, such as audio processing and encoding processing, on various data, such as audio data, content data, text data, and document data, as well as image data.

The data processing unit 122 separates processed data into pieces of data of a predetermined size, and generates write packets for the respective separated pieces of data. The data processing unit 122 inputs a write packet via the bus 42 to the port 31, and instructs the memory controller 22 to write data to an address specified in the RAM 23.

A data write/read process performed by the computer 1 is described next with reference to a flowchart shown in FIG. 6. In the description given below, the time length of a frame is 1 μs, and the number of time slots for a frame is eighteen. In addition, two external apparatuses, which are not shown, (hereinafter, referred to as apparatuses A and B) are connected to the input/output interface 17 of the computer 1. Data input/output between the apparatus A and the RAM 23 is performed via the input/output interface 17, the bus 45, and the port 32. Data input/output between the apparatus B and the RAM 23 is performed between the input/output interface 17, the bus 46, and the port 33.

In step S1, the access time setting unit 121 calculates the numbers of time slots to be allocated for input and output via each port. More specifically, the access time setting unit 121 acquires information representing the transfer speed of data input/output via the ports 32 and 33. The information representing the data transfer speed is input, for example, from the apparatus A or B via the input/output interface 17 and the bus 44 to the access time setting unit 121. The access time setting unit 121 calculates the numbers of time slots to be allocated for input and output via the ports 32 and 33 in accordance with the transfer speed of data input/output via the ports 32 and 33.

For example, when the bus width of the buses 45 and 46 is 64 bits and the bus clock of the buses 45 and 46 is 400 MHz, the memory band (bandwidth) of the RAM 23 is 25.6 Gbps (=64 bits×400 MHz) and the data transfer amount per time slot is about 1.42 Kbits (=25.6 Gbps×1 µs÷18). In this case, when image data that includes pixels composed of 4000 rows and 2000 columns, that has color information of 10 bits corresponding to respective three RGB primary colors for each pixel, and that has twenty-four frames per second, that is, image data whose transfer speed is about 6.04 Gbps (=4000 pixels×2000 pixels×10 bits×3 colors×24 frames), is input or output, the number of time slots necessary for input or output of the image data is about 4.25 (=6.04 Gbps×1 µs÷1.42 Kbits), and the value obtained by rounding up to a whole number, which is 5, is the number of time slots necessary (to be allocated) for writing (inputting) or reading (outputting) of the image data.

Figure 7:
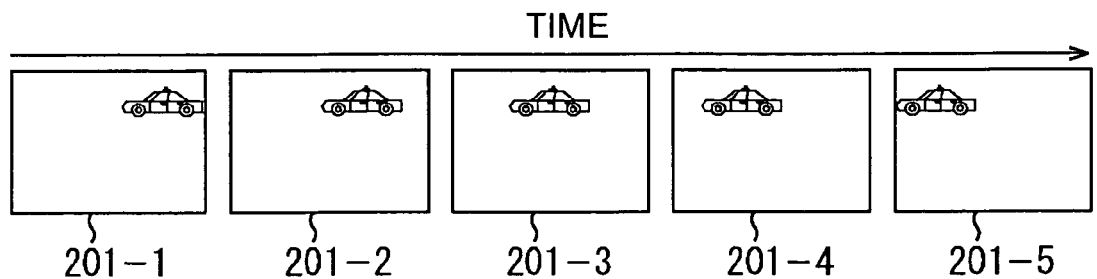
FIG. 7 illustrates an example of image data input to a port of the memory controller.
Figure 8:
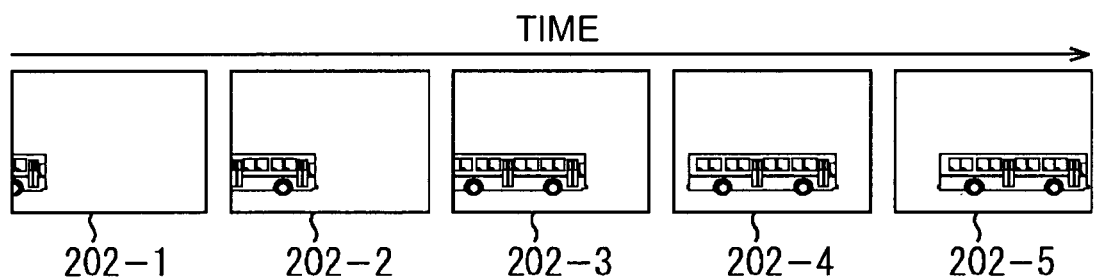
FIG. 8 illustrates an example of image data input to another port of the memory controller.
Figure 9:
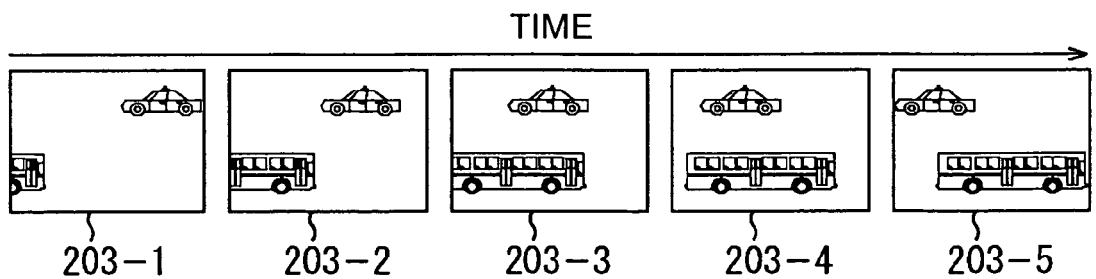
FIG. 9 illustrates an example of image data output from a port of the memory controller.

The data write/read process performed by the computer 1 will now be described by taking an example. Standard-definition (SD) image data that is constituted by frames 201-1 to 201-5 shown in FIG. 7 and that has a standard resolution is input from the apparatus A to the port 32, and SD image data that is constituted by frames 202-1 to 202-5 shown in FIG. 8 and that has a standard resolution is input from the apparatus B to the port 33. The frames 201-1 to 201-5 are combined with the frames 202-1 to 202-5, respectively, by the data processing unit 122. SD image data that is constituted by frames 203-1 to 203-5 shown in FIG. 9 generated by combining the frames 201-1 to 201-5 and the frames 202-1 to 202-5 and that has a standard resolution is output from the port 32 to the apparatus A. In this example, the number of time slots to be allocated for input via the port 32 is 3, the number of time slots to be allocated for input via the port 33 is 2, the number of time slots to be allocated for output via the port 32 is 3, and the number of time slots to be allocated for output via the port 33 is 0.

In step S2, the access time setting unit 121 sets values of the access time specification registers 102-1 to 102-4. More specifically, the access time setting unit 121 generates access time setting signals representing the numbers of time slots calculated in step S1, and supplies the generated access time setting signals to the access time specification registers 102-1 to 102-4 via the bus 41. Each of the access time specification registers 102-1 to 102-4 sets the number of time slots to be allocated for input or output via a corresponding port in accordance with the access time setting signal.

In step S3, the sequencer 103 determines allocation of time slots to priority ports. More specifically, the sequencer 103 reads the numbers of time slots set in the access time specification registers 102-1 to 102-4, and determines time slots to be allocated to priority ports, that is, the ports 32 and 33, in accordance with the read numbers of time slots.

Figure 10:
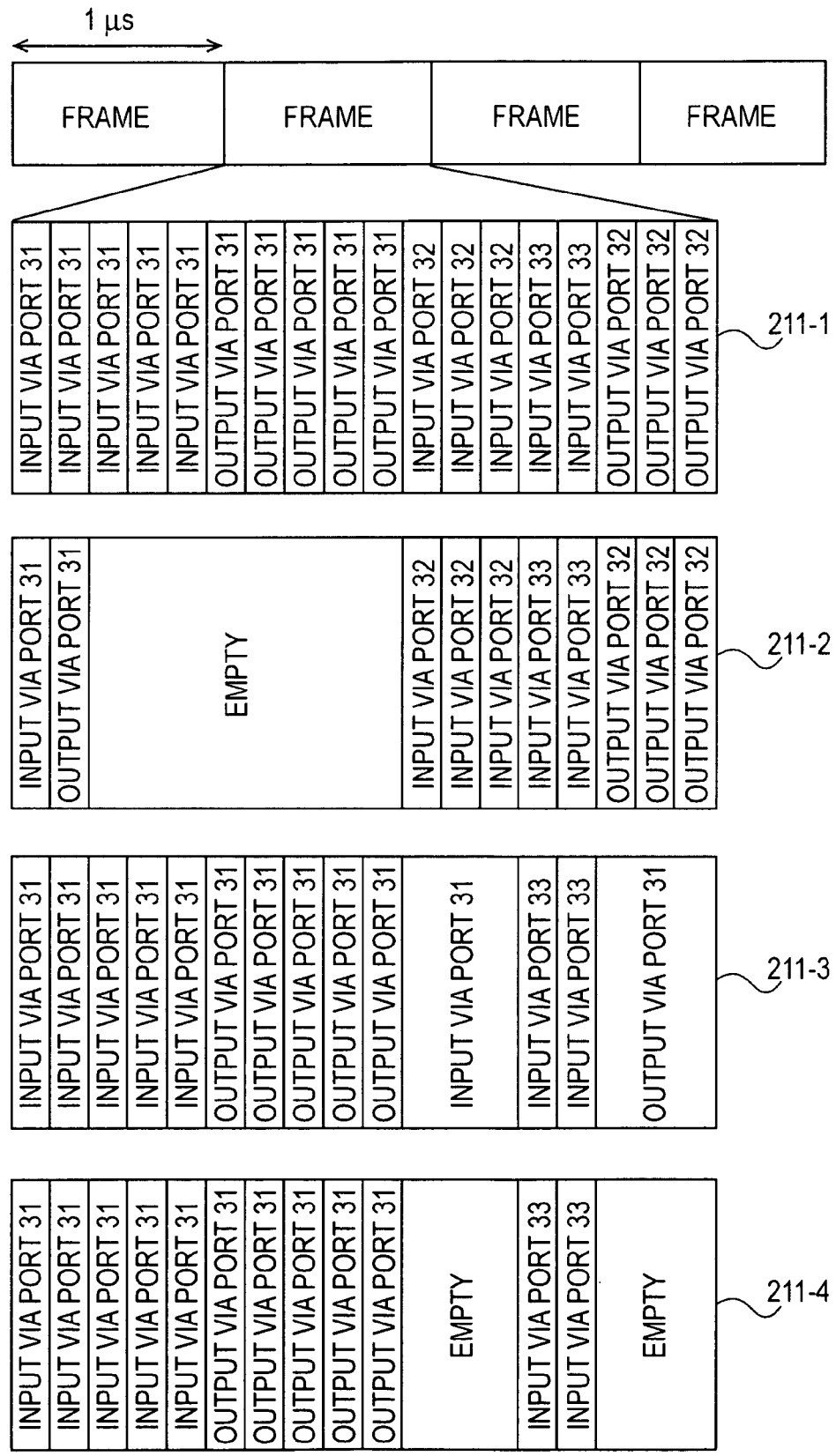
FIG. 10 illustrates examples of the frame structure.

FIG. 10 shows examples of allocation of time slots within a frame. A frame 211-1 is an example of a case where the memory bandwidth of the RAM 23 is used to the greatest extent possible, that is, a case where the total sum of the transfer speeds of data input and output via the ports 31 to 33 is equal to or more than the memory bandwidth of the RAM 23. A frame 211-2 is an example of a case where the transfer speed of data input and output via the port 31 to and from the data processing unit 122 is lower. Frames 211-3 and 211-4 will be described later.

As in the frames 211-1 and 211-2, the sequencer 103 keeps time slots in an initial portion of the frame for allocation to the port 31, and allocates to the ports 32 and 33 time slots from the rear end of the frame. In this case, three time slots, that is, the eleventh to the thirteenth time slots of the frame, are allocated for input via the port 32. Two time slots, that is, the fourteenth to the fifteenth time slots of the frame, are allocated for input via the port 33. Three time slots, that is, the sixteenth to the eighteenth time slots of the frame, are allocated for output via the port 32. Since the value of the access time specification register 102-4 is set to 0, no time slot is allocated for data output via the port 33.

The positions and ranges of the time slots within the frame allocated to the ports 32 and 33 are fixed until the values of the access time specification registers 102-1 to 102-4 are changed.

In step S4, the sequencer 103 determines allocation of time slots to a variable port. More specifically, the sequencer 103 detects the amount of write packets stored in the buffer 101-1 and the amount of read packets stored in the buffer 101-4, that is, the amount of stored read and write packets input via the port 31. The sequencer 103 allocates, in accordance with the amount of packets stored in the buffers 101-1 and 101-4, empty time slots, which are not allocated to the port 32 or 33, to the port 31.

For example, if all the empty time slots are used for processing packets stored in the buffers 101-1 and 101-4 (for writing/reading data to/from the RAM 23 via the port 31), five time slots, that is, the first to the fifth time slots of the frame, are allocated for input via the port 31, and five time slots, that is, the sixth to the tenth time slots of the frame, are allocated for output via the port 31, as in the frame 211-1.

In addition, for example, if all the empty time slots need not be used for processing packets stored in the buffers 101-1 and 101-4 (for writing/reading data to/from the RAM 23 via the port 31), the first time slot of the frame is allocated for input via the port 31, the second time slot of the frame is allocated for output via the port 31, and eight time slots, that is, the third to the tenth time slots of the frame function as empty time slots, which are allocated to no port, as in the frame 211-2.

As described above, allocation of time slots in the initial portion of the frame to the port 31 causes the advantages described below. In other words, if data input/output between the CPU 21 (the data processing unit 122) and the memory controller 22 is delayed, the length of the down time of the CPU 21 increases by the delay, thus degrading the processing ability of the CPU 21. For example, in the present frame, if a write packet or a read packet input from the CPU 21 is to be processed in the next frame, since time slots in the initial portion of the frame are allocated to the port 31, processing required from the CPU 21 is performed preferentially in the next frame. Thus, the length of the down time of the CPU 21 can be reduced.

In step S5, the sequencer 103 determines whether or not the next time slot is allocated to a priority port. In other words, the sequencer 103 determines whether or not the next time slot is allocated to a priority port, that is, whether or not the next time slot is allocated to the port 32 or 33. If it is determined that the next time slot is allocated to a priority port, the process proceeds to step S6.

In step S6, the sequencer 103 determines whether or not data input or output via the priority port to which the time slot is allocated is required. More specifically, the sequencer 103 examines a storage condition of a buffer corresponding to the priority port to which the time slot is allocated. If the time slot is allocated for input via the port 32, the sequencer 103 determines whether or not a write packet input via the port 32 is stored in the buffer 101-2. If the time slot is allocated for input via the port 33, the sequencer 103 determines whether or not a write packet input via the port 33 is stored in the buffer 101-3. If the time slot is allocated for output via the port 32, the sequencer 103 determines whether or not a read packet input via the port 32 is stored in the buffer 101-5. If the time slot is allocated for output via the port 33, the sequencer 103 determines whether or not a read packet input via the port 33 is stored in the buffer 101-6.

If a write packet or a read packet is not stored in a buffer corresponding to a priority port to which the time slot is allocated, the sequencer 103 determines that data input or output via the priority port to which the time slot is allocated is not required, and the process proceeds to step S7.

In step S7, the sequencer 103 changes allocation of the time slot. More specifically, the sequencer 103 examines storage conditions of the buffers 101-1 and 101-4 corresponding to a variable port, that is, the port 31. If a write packet is stored in the buffer 101-1 or if a read packet is stored in the buffer 101-4, the sequencer 103 changes allocation of a time slot such that the time slot is allocated for input or output via the port 31. For example, if data input or output via the port 32 is not required, the eleventh to the thirteenth time slots, which are originally allocated for input via the port 32, are allocated for input via the port 31, and the sixteenth to the eighteenth time slots, which are originally allocated for output via the port 32, are allocated for output via the port 31, as shown in the frame 211-3 in FIG. 10.

If no packet is stored in the buffer 101-1 or 101-4, that is, if data input or output via the port 31 is not required, even if data input or output via the port 32 is not required, time slots originally allocated to the port 32 function as empty time slots without being allocated to another port, as shown in the frame 211-4 in FIG. 10.

If it is determined in step S6 that data input or output via the priority port to which the time slot is allocated is required, that is, if it is determined that a write packet or a read packet is stored in a buffer corresponding to the priority port to which the time slot is allocated, the processing in step S7 is skipped. The process proceeds to step S8 without changing allocation of the time slot.

If it is determined in step S5 that the time slot is allocated to a variable port, that is, the port 31, the processing in steps S6 and S7 is skipped. The process proceeds to step S8.

In step S8, the sequencer 103 sets an input/output channel for data. More specifically, if the time slot is allocated for input via the port 31, the sequencer 103 supplies a read instruction signal to the buffer 101-1, and causes the buffer 101-1 to start supplying a write packet stored in the buffer 101-1 to the MUX 104. The sequencer 103 supplies an operation control signal to the MUX 104, and controls the MUX 104 to select the write packet supplied from the buffer 101-1 and to supply the selected write packet to the separator circuit 106.

In addition, the sequencer 103 supplies an operation control signal to the separator circuit 106. The sequencer 103 controls the separator circuit 106 to separate the write packet supplied from the MUX 104 into an address portion and a data portion, to supply the data portion to the RAM 23 via the bus 47, and to supply the address portion to the MUX 107. In addition, the sequencer 103 supplies an operation control signal to the MUX 107. The sequencer 103 controls the MUX 107 to supply to the RAM 23 via the bus 48 the address portion of the write packet supplied from the separator circuit 106. Accordingly, writing of data set in the data portion of the write packet input via the port 31 starts from an address of the RAM 23 described in the address portion.

Similarly, if the time slot is allocated for input via the port 32, the sequencer 103 supplies a read instruction signal to the buffer 101-2, and supplies operation control signals to the MUX 104, the separator circuit 106, and the MUX 107. Accordingly, writing of data set in the data portion of a write packet input via the port 32 starts from an address of the RAM 23 described in the address portion. If the time slot is allocated for input via the port 33, the sequencer 103 supplies a read instruction signal to the buffer 101-3, and supplies operation control signals to the MUX 104, the separator circuit 106, and the MUX 107. Accordingly, writing of data set in the data portion of a write packet input via the port 33 starts from an address of the RAM 23 described in the address portion.

If the time slot is allocated for output via the port 31, the sequencer 103 supplies a read instruction signal to the buffer 101-4, and causes the buffer 101-4 to start supplying a read packet stored in the buffer 101-4 to the MUX 105. The sequencer 103 also supplies an operation control signal to the MUX 105, and controls the MUX 105 to select the read packet supplied from the buffer 101-4 and to supply the selected read packet to the MUX 107. In addition, the sequencer 103 supplies an operation control signal to the MUX 107, and controls the MUX 107 to supply via the bus 48 to the RAM 23 the address portion of the read packet supplied from the MUX 105. Accordingly, reading of data starts from an address of the RAM 23 described in the address portion of the read packet input via the port 31, and the read data is supplied via the bus 49 to the buffers 101-7 to 101-9.

The sequencer 103 supplies a write instruction signal to the buffer 101-7, and causes the buffer 101-7 to start storing data supplied from the RAM 23 via the bus 49. The data processing unit 122 inputs, according to need, a read instruction signal to the buffer 101-7 via the bus 42 and the port 31. The data processing unit 122 causes the data stored in the buffer 101-7 to be output via the port 31, and acquires the output data via the bus 42.

Similarly, if the time slot is allocated for output via the port 32, the sequencer 103 supplies a read instruction signal to the buffer 101-5, supplies operation control signals to the MUXes 105 and 107, and inputs a write instruction signal to the buffer 101-8. Accordingly, reading of data starts from an address of the RAM 23 described in the address portion of a read packet input via the port 32, and storing of the read data into the buffer 101-8 starts. The apparatus A inputs, according to need, a read instruction signal to the buffer 101-8 via the input/output interface 17, the bus 45, and the port 32. The apparatus A causes the data stored in the buffer 101-8 to be output via the port 32, and acquires the output data via the bus 45 and the input/output interface 17.

In addition, similarly, if the time slot is allocated for output via the port 33, the sequencer 103 supplies a read instruction signal to the buffer 101-6, supplies operation control signals to the MUXes 105 and 107, and inputs a write instruction signal to the buffer 101-9. Accordingly, reading of data starts from an address of the RAM 23 described in the address portion of a read packet input via the port 33, and storing of the read data into the buffer 101-9 starts. The apparatus B inputs, according to need, a read instruction signal to the buffer 101-9 via the input/output interface 17, the bus 46, and the port 33. The apparatus B causes the data stored in the buffer 101-9 to be output via the port 33, and acquires the output data via the bus 46 and the input/output interface 17.

In step S9, the sequencer 103 monitors a point in time for switching a frame and a point in time for switching a time slot in accordance with a clock signal supplied from the outside.

In step S10, the sequencer 103 determines if it is a point in time for switching a time slot in accordance with a monitoring result obtained by the processing in step S9. If it is determined in step S10 that it is a point in time for switching a time slot, the process proceeds to step S11.

In step S11, the sequencer 103 determines if it is a point in time for switching a frame in accordance with a monitoring result obtained by the processing in step S9. If it is determined in step S11 that it is not a point in time for switching a frame, that is, if it is determined that it is a point in time only for switching a time slot, the process proceeds to step S12.

In step S12, the sequencer 103 determines if it is a point in time for switching an input/output channel for data. If it is determined in step S12 that it is not a point in time for switching an input/output channel for data, that is, if it is determined that allocation of the next time slot is not changed from allocation of the present time slot, the process returns to step S9. Then, the processing in steps S9 to S12 is repeated until it is determined in step S11 that it is a point in time for switching a frame or until it is determined in step S12 that it is a point in time for switching an input/output channel for data.

If it is determined in step S12 that it is a point in time for switching an input/output channel for data, that is, if it is determined that allocation of the next time slot is changed from allocation of the present time slot, the process returns to step S5. Then, the processing in step S5 and the subsequent processing are performed. After an input/output channel for data is changed, writing/reading of data to/from the RAM 23 is performed.

If it is determined in step S11 that it is a point in time for switching a frame, the process proceeds to step S13.

In step S13, the access time setting unit 121 determines whether or not a data transfer speed is changed. More specifically, if the transfer speed of data input/output via the port 32 or 33, which is a priority port, is not changed, the access time setting unit 121 determines that the data transfer speed is not changed. The process returns to step S4, and the processing in step S4 and the subsequent processing are performed. In other words, after a time slot allocated to the port 31, via which data input/output is performed to/from the data processing unit 122, is changed in accordance with a request for data input/output from the data processing unit 122 while time slots allocated to the ports 32 and 33 are fixed, writing/reading of data to/from the RAM 23 is performed.

When it is determined in step S13 that a data transfer speed is changed, for example, if a user instructs to change processing or the like and information representing a change in the data transfer speed is input from the apparatus A or B to the access time setting unit 121 or if a new apparatus requires data input or output and information representing a data transfer speed is input from the new apparatus to the access time setting unit 121, the process returns to step S1, and the processing in step S1 and the subsequent processing are performed. In other words, after values of the access time specification registers 102-1 to 102-4 and time slots allocated to the ports 31 to 33 are changed in accordance with a change in the transfer speed of data input/output via the port 32 or 33, which is a priority port, writing/reading of data to/from the RAM 23 is performed.

Figure 11:
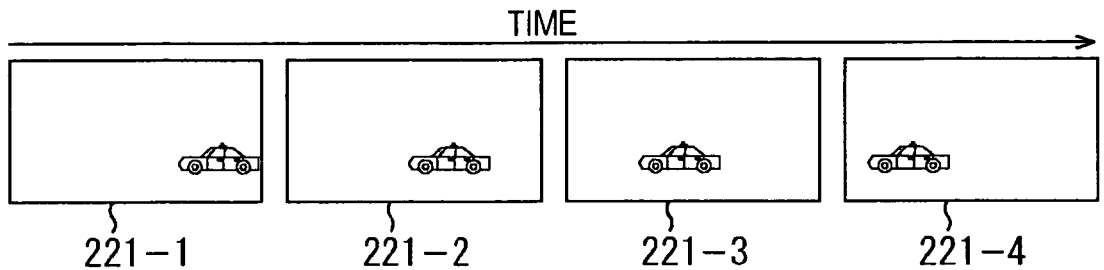
FIG. 11 illustrates another example of image data input to a port of the memory controller.
Figure 12:
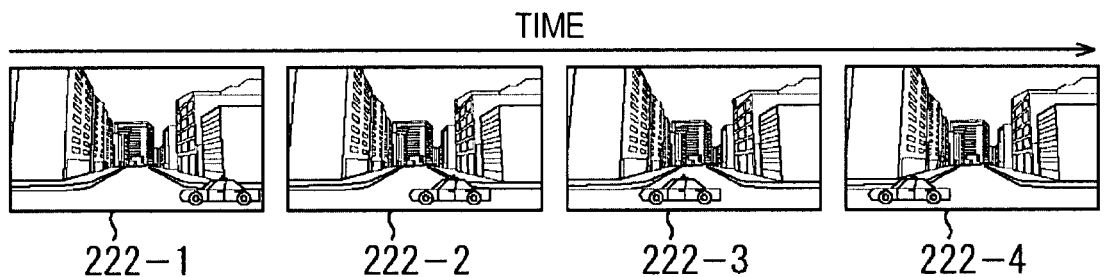
FIG. 12 illustrates another example of image data output from a port of the memory controller.
Figure 13:
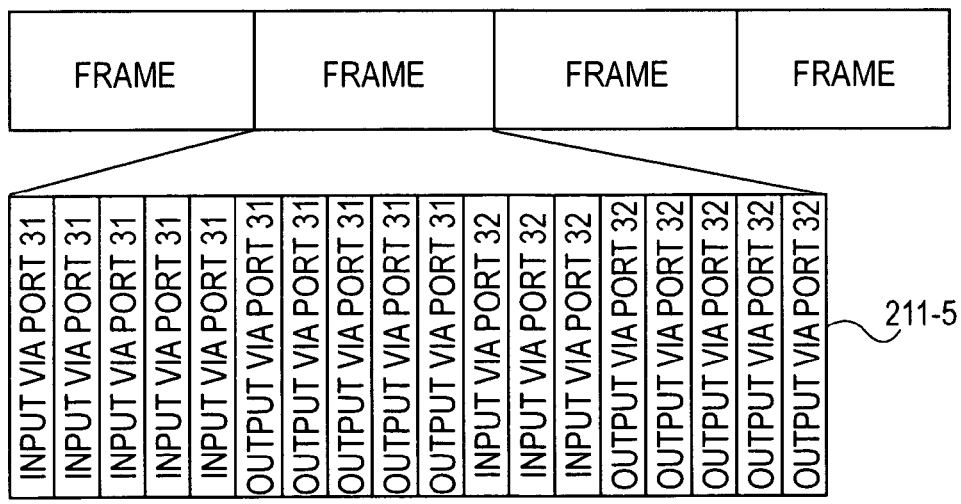
FIG. 13 shows another example of the frame structure.

For example, when the apparatus A inputs to the port 32 SD image data that is constituted by frames 221-1 to 221-4 shown in FIG. 11 and that has a standard resolution, high-definition (HD) image data that is stored in advance in the RAM 23 and has a high resolution is combined with the frames 221-1 to 221-4 by the data processing unit 122, and combined HD image data that is constituted by frames 222-1 to 222-4 shown in FIG. 12 and that has a high resolution is output via the port 32 to the apparatus A, time slots allocated to respective ports are changed, as shown in a frame 211-5 in FIG. 13. In other words, compared with the frame 211-1 shown in FIG. 10, the number of time slots allocated for output via the port 32 that outputs HD image data with a higher transfer speed increases from 3 to 5, and no time slot is allocated to the port 33 since data input/output via the port 33 is not performed. In addition, since the total number of time slots allocated to the ports 32 and 33 is not changed, the total number of time slots allocated to input and output via the port 31 is not changed.

As described above, necessary time slots are reliably allocated to the ports 32 and 33 for each frame in accordance with a transfer speed of input/output data. In other words, times for writing to the RAM 23 data input via the ports 32 and 33 and times for reading from the RAM 23 data output via the ports 32 and 33 are reliably ensured for each frame. Thus, for example, by inputting/outputting, via the port 32 or 33, real-time processing data that needs to be processed in roughly real time, such as image data or audio data, the data can be reliably written to or reading from the RAM 23 without data missing.

In addition, since write packets and read packets input via the ports 32 and 33 are reliably and regularly processed in predetermined time slots of each frame, times (latencies) between inputting of write packets or read packets via the port 32 or 33 and writing or reading of data to or from the RAM 23 are substantially constant. Thus, capacities of the buffers 101-2, 101-3, 101-5, and 101-6 necessary for temporarily storing packets input via the ports 32 and 33 can be set to substantially equal to the capacities of write packets and read packets processed within a frame. Thus, the necessary capacities can be reduced.

In addition, since only time slots necessary for data input/output are allocated to the ports 32 and 33 and time slots that are not allocated to the port 32 or 33 are allocated to the port 31, writing/reading of data to/from the RAM 23 can be performed by effectively using time slots within a frame, that is, by efficiently using a memory bandwidth of the RAM 23. In addition, if time slots allocated to the ports 32 and 33 are unused, since the time slots are appropriately allocated to the port 31, writing/reading of data to/from the RAM 23 can be performed by using the memory bandwidth of the RAM 23 more efficiently.

In addition, since time slots in an initial portion of a frame that are not allocated to the port 32 or 33 are allocated to the port 31, the length of a waiting time for data input/output of the CPU 21 (the data processing unit 122) that uses the port 31 can be reduced.

Although the computer including the memory controller is described as an example of an information processing apparatus in the foregoing embodiment, the information processing apparatus can have any configuration as long as the information processing apparatus controls writing/reading of data to/from a memory using a memory controller. For example, such an information processing apparatus may be a video camera; a digital still camera; a game device; a portable information terminal, such as a portable computer, a cellular telephone, or a portable game device; a storage device, such as an optical disc device or a home server; or the like.

In addition, although an example in which SD image data is input/output via the ports 31 to 33 is described in the foregoing embodiment (see FIGS. 7, 8, and 9), image data other than SD image data (for example, HD image data) may be input/output via the ports 31 to 33. In addition, different types of image data (for example, SD image data and HD image data) may be input/output via the ports 31 to 33 depending on the port.

In addition, although an example in which the CPU 21 (the data processing unit 122) combines two pieces of SD image data is described in the foregoing embodiment (see FIGS. 7, 8, and 9), a plurality of pieces of HD image data may be combined with each other or SD image data and HD image data may be combined with each other. In addition, the present invention is not necessarily applied to a case where the CPU 21 (the data processing unit 122) combines image data. The present invention can also be applied to cases where the CPU 21 (the data processing unit 122) performs various types of processing, such as image processing, editing processing, and encoding processing. In addition, the present invention is not necessarily applied to a case where the CPU 21 (the data processing unit 122) processes image data. The present invention can also be applied to a case where the CPU 21 (the data processing unit 122) processes data, such as various content data including audio data.

In addition, although the CPU 21 (the access time setting unit 121) calculates the numbers of time slots set in the access time specification registers 102-1 to 102-4 in the foregoing embodiment, a calculator, such as a processor, provided independent of the CPU 21 may calculate the number of time slots. In addition, the calculator may be provided inside the memory controller 22. In addition, the CPU 21 may function as a multicore processor so that two or more processor cores can share calculation of the numbers of time slots set in the access time specification registers 102-1 to 102-4.

In addition, the present invention is not necessarily applied to control of writing/reading of data to/from a volatile memory, such as the RAM 23. The present invention is also applicable to control of writing/reading of data to/from a nonvolatile memory, such as an electrically erasable and programmable read-only memory (EEPROM), a hard disk drive (HDD), a megnetoresistive random-access memory (MRAM), a ferroelectric random-access memory (FeRAM), or an ovonic unified memory (OUM).

In addition, the present invention is also applicable to a case where the number of memories for controlling writing/reading of data is two or more.

In addition, a memory controller may control writing/reading of data to/from a memory installed in an external apparatus.

In addition, although the number of priority ports is two, that is, the ports 32 and 33, in the foregoing description, the number of priority ports may be one. Alternatively, the number of priority ports may be three or more. In addition, although the number of variable ports is one, that is, the port 31, in the foregoing description, the number of variable ports may be two or more.

In addition, reducing the width (time length) of a frame and frequently changing an input/output channel for data to/from the RAM 23 reduces the capacities of the buffers 101-1 to 101-9. However, since loss in the access time is generated by frequently changing the address of the RAM 23 accessed, the effective value of the memory bandwidth of the RAM 23 may be smaller than its theoretical value. Thus, it is desirable that the width of a frame be set, taking into consideration the balance between the capacity of a buffer and the effective value of the memory bandwidth.

The foregoing series of processing may be performed by hardware or software. If the foregoing series of processing is performed by software, a program constituting the software is installed from a network or a recording medium on a computer installed in dedicated hardware or, for example, a general-purpose personal computer capable of performing various functions by installing various programs.

The recording medium not only includes a package medium, such as a magnetic disk, an optical disc, a magnetic optical disc, or a semiconductor memory, which records the program and is distributed in order to provide the program to a user independent of the computer, but also includes the ROM 24 and the hard disk mounted in the recording unit 14 which record the program and are built in the computer to be provided to the user.

The program for performing the series of foregoing processing may be installed on the computer via wired or wireless communication, such as a local area network, the Internet, or digital satellite broadcasting, using an interface, such as a router or a modem, according to need.

In this specification, steps defining a program stored in the recording medium are not necessarily performed in chronological order in accordance with the written order. The steps may be performed in parallel or independently without being performed in chronological order.

It should be understood by those skilled in the art that various modifications, combinations, sub-combinations and alterations may occur depending on design requirements and other factors insofar as they are within the scope of the appended claims or the equivalents thereof.

What is claimed is:

1. A memory control device for writing to a memory data input via a port section and for reading from the memory data output via the port section, the memory control device comprising:
   setting means for setting, in accordance with a transfer speed of first input data input via the port section, a write-enable time for enabling writing of the first input data to the memory for each predetermined period and for setting, in accordance with a transfer speed of first output data output via the port section, a read-enable time for enabling reading of the first output data from the memory for the predetermined period; and
   write/read control means for controlling data writing/reading to/from the memory such that second input data input via the port section is written to the memory or second output data output via the port section is read from the memory within a time other than the write-enable time and the read-enable time within the predetermined period.

2. The memory control device according to claim 1, wherein:
   the port section includes a plurality of ports;
   the first input data is input via a first port;
   the first output data is output via the first port;
   the second input data is input via a second port; and
   the second output data is output via the second port.

3. The memory control device according to claim 1, wherein the first input data and the first output data are real-time processing data to be processed in roughly real time.

4. The memory control device according to claim 1, wherein the second input data and the second output data are data to be processed by a processor of an apparatus provided with the memory.

5. The memory control device according to claim 1, wherein the write/read control means allocates the write-enable time and the read-enable time for the predetermined period, and controls data writing/reading to/from the memory such that the first input data is written to the memory within the write-enable time and that the first output data is read from the memory within the read-enable time.

6. The memory control device according to claim 1, wherein the write/read control means controls data writing/reading to/from the memory such that, when writing of the first input data is not required, the second input data is written to the memory or the second output data is read from the memory within the write-enable time.

7. The memory control device according to claim 1, wherein the write/read control means controls data writing/reading to/from the memory such that, when reading of the first output data is not required, the second input data is written to the memory or the second output data is read from the memory within the read-enable time.

8. The memory control device according to claim 1, wherein the write/read control means allocates the time other than the write-enable time and the read-enable time within the predetermined period to an initial portion of the predetermined period.

9. The memory control device according to claim 1, wherein the setting means sets the write-enable time and the read-enable time in accordance with the number of time slots acquired by splitting the predetermined period into a predetermined number of equally separated times.

10. A memory control method for writing to a memory data input via a port section and for reading from the memory data output via the port section, the memory control method comprising the steps of:
  setting a write-enable time for enabling writing of first input data to the memory for each predetermined period in accordance with a transfer speed of the first input data input via the port section and a read-enable time for enabling reading of first output data from the memory for the predetermined period in accordance with a transfer speed of the first output data output via the port section; and
  controlling data writing/reading to/from the memory such that second input data input via the port section is written to the memory or second output data output via the port section is read from the memory within a time other than the write-enable time and the read-enable time within the predetermined period.

11. A program for causing a computer for writing to a memory data input via a port section and for reading from the memory data output via the port section to perform memory control processing, the program comprising the steps of:
  setting a write-enable time for enabling writing of first input data to the memory for each predetermined period in accordance with a transfer speed of the first input data input via the port section and a read-enable time for enabling reading of first output data from the memory for the predetermined period in accordance with a transfer speed of the first output data output via the port section; and
  controlling data writing/reading to/from the memory such that second input data input via the port section is written to the memory or second output data output via the port section is read from the memory within a time other than the write-enable time and the read-enable time within the predetermined period.

12. An information processing apparatus comprising:
  a memory for storing data;
  setting means for setting, in accordance with a transfer speed of first input data input via a port section, a write-enable time for enabling writing of the first input data to the memory for each predetermined period and for setting, in accordance with a transfer speed of first output data output via the port section, a read-enable time for enabling reading of the first output data from the memory for the predetermined period; and
  write/read control means for controlling data writing/reading to/from the memory such that second input data input via the port section is written to the memory or second output data output via the port section is read from the memory within a time other than the write-enable time and the read-enable time within the predetermined period.

13. The information processing apparatus according to claim 12, further comprising image processing means for performing image processing on data output from the port section and for inputting data subjected to the image processing to the port section.

14. A recording medium on which the program as set forth in claim 11 is recorded.

15. A memory control device for writing to a memory data input via a port section and for reading from the memory data output via the port section, the memory control device comprising:
  a setting unit that sets, in accordance with a transfer speed of first input data input via the port section, a write-enable time for enabling writing of the first input data to the memory for each predetermined period and that sets, in accordance with a transfer speed of first output data output via the port section, a read-enable time for enabling reading of the first output data from the memory for the predetermined period; and
  a write/read controller that controls data writing/reading to/from the memory such that second input data input via the port section is written to the memory or second output data output via the port section is read from the memory within a time other than the write-enable time and the read-enable time within the predetermined period.

16. An information processing apparatus comprising:
  a memory for storing data;
  a setting unit that sets, in accordance with a transfer speed of first input data input via a port section, a write-enable time for enabling writing of the first input data to the memory for each predetermined period and that sets, in accordance with a transfer speed of first output data output via the port section, a read-enable time for enabling reading of the first output data from the memory for the predetermined period; and
  a write/read controller that controls data writing/reading to/from the memory such that second input data input via the port section is written to the memory or second output data output via the port section is read from the memory within a time other than the write-enable time and the read-enable time within the predetermined period.

* * * * *